United States Patent
Ye et al.

(10) Patent No.: US 10,622,507 B2
(45) Date of Patent: Apr. 14, 2020

(54) NITRIDE UNDERLAYER AND FABRICATION METHOD THEREOF

(71) Applicant: XIAMEN SANAN OPTOELECTRONICS TECHNOLOGY CO., LTD., Xiamen (CN)

(72) Inventors: Da-qian Ye, Xiamen (CN); Dongyan Zhang, Xiamen (CN); Chaoyu Wu, Xiamen (CN); Duxiang Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 20 days.

(21) Appl. No.: 16/145,127

(22) Filed: Sep. 27, 2018

(65) Prior Publication Data

US 2019/0035969 A1 Jan. 31, 2019

Related U.S. Application Data

(63) Continuation of application No. PCT/CN2018/078657, filed on Mar. 12, 2018.

(30) Foreign Application Priority Data

Apr. 1, 2017 (CN) .......................... 2017 1 0214025

(51) Int. Cl.
| | |
|---|---|
| H01L 21/00 | (2006.01) |
| H01L 33/00 | (2010.01) |
| H01L 33/32 | (2010.01) |
| H01L 21/02 | (2006.01) |
| H01L 33/20 | (2010.01) |

(Continued)

(52) U.S. Cl.
CPC ...... *H01L 33/0075* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 21/02603* (2013.01); *H01L 21/02658* (2013.01); *H01L 33/007* (2013.01); *H01L 33/20* (2013.01);
(Continued)

(58) Field of Classification Search
CPC ............. H01L 31/03048; H01L 33/007; H01L 31/1856; H01L 33/24; H01L 29/0669; H01L 21/02389; H01L 21/02603
USPC ......... 438/7, 69, 775, 800; 257/79, 431, 432
See application file for complete search history.

(56) References Cited

U.S. PATENT DOCUMENTS

| | | | | |
|---|---|---|---|---|
| 8,227,818 B2 * | 7/2012 | Weisbuch | .............. | B82Y 20/00 257/103 |
| 2010/0265979 A1 * | 10/2010 | Weisbuch | .............. | B82Y 20/00 372/45.01 |

(Continued)

FOREIGN PATENT DOCUMENTS

CN 105734674 A 7/2016

*Primary Examiner* — S. V. Clark
(74) *Attorney, Agent, or Firm* — Syncoda LLC; Feng Ma

(57) ABSTRACT

A nitride underlayer includes: a pattern substrate with lattice planes of different growth rates; a nitride nucleating layer over the pattern substrate; a first nitride layer with three-dimensional growth over the nitride nucleating layer, and forming a nanopillar structure at a top of the substrate; a second nitride layer with two-dimensional growth over the first nitride layer, and folding into an uncracked plane over the nanopillar structure.

20 Claims, 10 Drawing Sheets

(51) Int. Cl.
  *H01L 33/12*    (2010.01)
  *H01L 33/16*    (2010.01)
(52) U.S. Cl.
  CPC ............. *H01L 33/32* (2013.01); *H01L 33/12* (2013.01); *H01L 33/16* (2013.01)

(56) References Cited

U.S. PATENT DOCUMENTS

2012/0074525 A1* 3/2012 Kaeding ............... C30B 23/025
                                                    257/615
2013/0193466 A1* 8/2013 Sudhiranjan .......... H01L 33/007
                                                     257/98
2018/0047871 A1   2/2018 Jung et al.
2018/0119307 A1* 5/2018 Lo ......................... C30B 25/105

* cited by examiner

NITRIDE UNDERLAYER AND FABRICATION METHOD THEREOF

CROSS-REFERENCE TO RELATED APPLICATIONS

The present application is a continuation of, and claims priority to, PCT/CN2018/078657 filed on Mar. 12, 2018, which claims priority to Chinese Patent Application No. 201710214025.5 filed on Apr. 1, 2017. The disclosures of these applications are hereby incorporated by reference in their entirety.

BACKGROUND

As the bandgap of nitride-based material covers entire visible light range, optoelectronic devices such as light-emitting diodes (LEDs) fabricated by nitride-based materials are widely applied in fields like solid display, lighting and signal lights. The non-toxic nitride material has such advantages as high luminance, low work voltage and easy for miniaturization. Therefore, it is an irreversible trend to replace conventional light source with GaN-based light emitting diode. However, one of the keys to obtain nitride light emitting device of higher light-emitting efficiency lies in the improvement of photoelectric conversion efficiency and light extraction efficiency.

SUMMARY

The present disclosure relates to an epitaxial field of GaN semiconductor device, and particularly relates to a nitride layer with an embedded nanopillar structure over the pattern substrate and epitaxial technology thereof. Various embodiments provide a nitride layer with an embedded nanopillar structure and fabrication method thereof, in combination with a pattern substrate for improving light extraction efficiency of GaN-based light emitting diode According to a first aspect of present disclosure, a fabrication method of nitride underlayer is provided, comprising: 1) providing a pattern substrate with lattice planes of different growth rates; 2) pre-treating the pattern substrate; 3) forming a nitride nucleating layer over the pattern substrate; 4) forming a first nitride layer over the pattern substrate under three-dimensional growth conditions, which forms a nanopillar at the top of the pattern substrate; 5) forming a second nitride layer over the first nitride layer under two-dimensional growth conditions, which folds an uncracked plane above the nanopillar to form an embedded nanopillar structure over the nitride underlayer.

In the above methods, pre-treat the pattern substrate with gases like $N_2$ and $H_2$; the treatment poses no influence on the substrate pattern shape; however, as the lattice plane at top and on the plane of the substrate pattern are different, the micro treatment effect of $N_2/H_2$ is different, resulting in different polarities and dangling bonds of the substrate surface.

In some embodiments, the substrate pattern can be a protrusion portion or a recess portion, wherein, the protrusion portion or the recess portion appears massive distribution with gap larger than or equal to 0.01 μm and size of 0.5-8 μm. In some embodiments, the substrate pattern comprises a series of protrusion portions in circular platform, prism platform, cone, pyramid shapes or their combinations, wherein, each protrusion portion is 0.5 μm high with preferred gap more than 0.01 μm. In some embodiments, the substrate pattern comprises a series of recess portions, wherein, the recess portion appears an inverted trapezoidal structure with a tilt side wall.

In some embodiments, the pattern substrate provided in step (1) has a protrusion portion and a plane portion, wherein, area of the protrusion top is smaller than that of the bottom portion.

In some embodiments, the protrusion portion top appears cone shape, and included angle between the top lattice plane and that of the non-protrusion portion is less than 5°.

In some embodiments, relationship of growth rates of different portions of the pattern substrate: non-protrusion portion>protrusion portion top>protrusion portion side wall.

In some embodiments, a nucleating layer is formed under quasi two-dimensional growth conditions in step (3), wherein, the quasi two-dimensional growth conditions refer to that the ratio between horizontal and vertical growth rates is between those of two-dimensional growth conditions and three-dimensional growth conditions.

In some embodiments, horizontal growth rate of the nucleating layer in the plane portion in step (3) is faster than that at the protrusion portion top.

In some embodiments, the nucleating layers formed in the plane portion and the protrusion portion in step (3) differ a lot in polarity and nucleation size. Under three-dimensional growth conditions, the nucleating layer in the plane portion favors growth of the nitride epitaxial layer with high growth rate, and the horizontal epitaxial growth rate is fast; the nucleating layer in the protrusion portion favors growth of the nanopillar with slow growth rate, and the horizontal epitaxial growth rate is slow. The growth rate of the nanopillar is slower than the growth rate of the nitride epitaxial layer.

In the above method, the nanopillar structure size can be adjusted by controlling thicknesses of the first nitride layer and the second nitride layer. The thicker the first nitride layer is, the smaller the nanopillar is. In some embodiments, the first nitride layer formed in step (4) is about 0.1-1.5 μm thick; the second nitride layer formed in step (5) is thicker than 2 μm; and the nanopillar structure is at the top of the substrate pattern with diameter of 10-100 nm and height of 0.1-1.5 μm.

In some embodiments, growth temperature of two-dimensional growth conditions is about 20-100° C. higher than that of three-dimensional growth conditions.

In some embodiments, growth rate of two-dimensional growth conditions is about one time to two times of that of three-dimensional growth conditions.

In some embodiments, V/III ratio of two-dimensional growth mode is less than about 2 times that of three-dimensional growth conditions.

In some embodiments, the nanopillar in sub-micron scale is formed in the nitride layer, and surrounds the top of each substrate, appearing periodic distribution, which avoids complexity of subsequent device fabrication. In subsequent device fabrication, the first nitride layer can prevent lateral erosion effect by different corrosive liquids on the substrate or the epitaxial layer.

According to a second aspect of the present disclosure, a nitride layer with an embedded nanopillar structure is provided, comprising: a pattern substrate with lattice planes of different growth rates; a nitride nucleating layer over the pattern substrate; a first nitride layer with three-dimensional growth over the nitride nucleating layer, with a nanopillar structure at the top of the nitride pattern; a second nitride layer with two-dimensional growth over the first nitride layer, which folds an uncracked plane above the nanopillar to form an embedded nanopillar structure over the nitride underlayer.

The substrate pattern is a protrusion portion or a recess portion, wherein, the protrusion portion or the recess portion appears massive distribution with gap larger than or equal to 0.01 μm and size of 0.5-8 μm. In some embodiments, the substrate pattern comprises a series of protrusion portions in circular platform, prism platform, cone, pyramid shapes or their combinations, wherein, the protrusion portion is at least 0.5 μm high with preferred gap larger than 0.01 μm. In some embodiments, the substrate pattern comprises a series of recess portions, wherein, the recess portion appears an inverted trapezoidal structure with a tilt side wall.

In some embodiments, the pattern substrate has a protrusion portion and a plane portion, wherein, area of the protrusion top is smaller than that of the bottom portion.

In some embodiments, the protrusion portion top appears cone shape, and included angle between the top lattice plane and that of the non-protrusion portion is less than 5°.

In some embodiments, the nanopillar diameter is 10-100 nm, and height is 0.1-1.5 μm.

In some embodiments, the nanopillar is in sub-micron scale, located at the top of the protrusion portion and appears periodic arrangement based on the arrangement of the protrusion portion.

In some embodiments, thickness of the second nitride layer is at least 2 μm.

According to a third aspect of the present disclosure, a nitride underlayer with an embedded nanopillar structure is provided, comprising: a pattern substrate, wherein, the pattern is a series of protrusion portions or recess portions over the surface; a nitride layer over the pattern substrate; a nanopillar structure in the nitride layer, wherein, the nanopillar is in sub-micron scale, and is at the top of the protrusion portion or the recess portion.

In the above structure, the nanopillar in sub-micron scale is in the nitride layer material, which avoids impact on device appearance and contact electrode fabrication.

In some embodiments, a series of mutually-isolated nanopillar structures are formed in the nitride underlayer, wherein, the nanopillar diameter is about 10-100 nm with difference not more than 0.5 μm.

In some embodiments, the nitride layer comprises a nitride nucleating layer, a first nitride layer through three-dimensional growth and a second nitride layer through two-dimensional growth, wherein, the nanopillar structure is formed at the substrate top by the first nitride layer and the second nitride layer.

In some embodiments, the protrusion portion or the recess portion appears massive distribution with gap larger than 0.01 μm and size of 0.5-8 μm.

In some embodiments, the substrate pattern is a protrusion portion. In some embodiments, the protrusion portion top appears platform shape, and included angle between the top lattice plane and that of the non-protrusion portion is less than 5°.

In some embodiments, the nitride layer comprises: a first nitride layer under three-dimensional growth conditions over the nitride nucleating layer, which forms a nanopillar structure at the top of the substrate pattern; a second nitride layer over the first nitride layer under two-dimensional growth conditions, which folds an uncracked plane above the nanopillar to form a series of mutually-isolated nanopillar structures in the nitride underlayer; wherein, the nanopillar diameter is about 10-100 nm with difference not more than 0.5 μm.

According to a fourth aspect of present disclosure, a nitride semiconductor photoelectric device is provided, comprising any of the nitride layer with an embedded nanopillar structure, and a light-emitting epitaxial layer over the nitride laminated layer, wherein, the light-emitting epitaxial layer comprises an n-type semiconductor layer, a light-emitting epitaxial layer and a p-type semiconductor layer.

In the above structure, on the one hand, the nanopillar structure in sub-micron scale is in the nitride layer material, which avoids impact on device appearance and contact electrode fabrication; and on the other hand, in combination with pattern substrate that improves material quality, the fabricated light emitting diode has higher photoelectric conversion efficiency.

The other features and advantages of this present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

DETAILED DESCRIPTION

Figure 1:
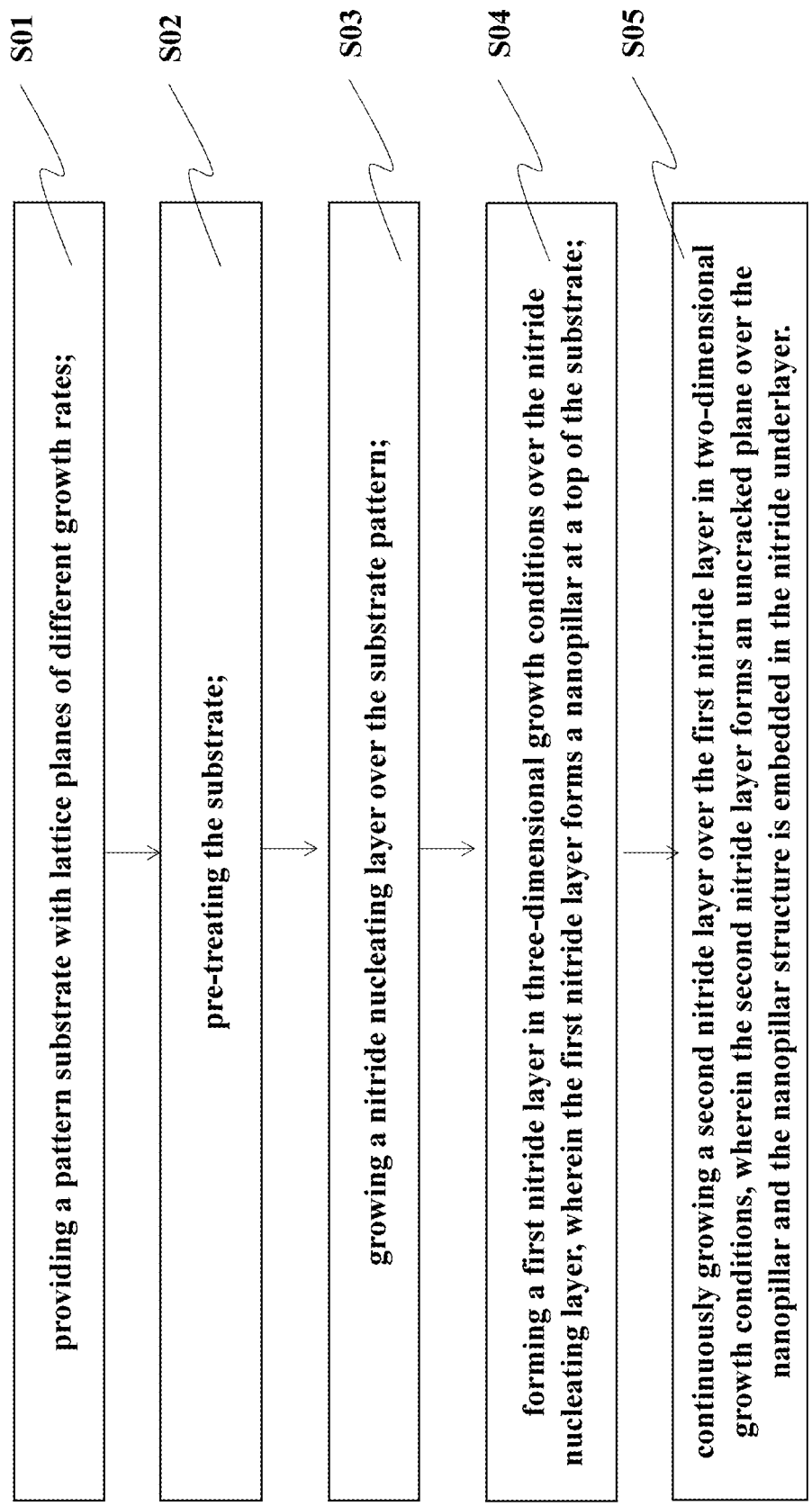
FIG. 1 is a fabrication diagram of a nitride layer with an embedded nanopillar structure according to some embodiments of the present disclosure.

The following embodiments, in combination with a pattern substrate, provide a nitride layer with an embedded nanopillar structure and fabrication method thereof that can improve extraction efficiency of the GaN light emitting diode. FIG. 1 shows the fabrication method of a nitride underlayer with an embedded nanopillar structure, mainly comprising:

S01: providing a pattern substrate with lattice planes of different growth rates;
S02: pre-treating the substrate with $H_2/N_2$;
S03: growing a nitride nucleating layer over the substrate;
S04: growing a first nitride layer under three-dimensional growth conditions through epitaxial growth;
S05: growing a second nitride layer under two-dimensional growth conditions through epitaxial growth.

Specifically, in step S01, the pattern substrate can be sapphire substrate or any other materials suitable for nitride growth, e.g., SiC; the substrate pattern can be a series of discrete protrusion portions or recess portions over the substrate surface; each protrusion portion (or recess portion) is at least 0.5 µm high (deep) with preferred gap more than 0.01 µm. When the substrate pattern is a protrusion portion, it is in circular platform, prism platform, cone, pyramid shapes or their combinations. In some embodiments, the protrusion portion top appears cone shape, and included angle between the top lattice plane and that of the non-protrusion portion is less than 5°. When the substrate is a recess portion, the recess portion appears an inverted trapezoidal structure with a tilt side wall, wherein, the lattice growth rate of the side wall is slower than that of the bottom lattice plane.

In the steps S03-S05, GaN, AlGaN, AlN or other nitrides can be used. The growth mode can be adjusted by adjusting such parameters as growth temperature, reaction chamber pressure and V/III ratio. Relationship of growth temperature for two growth modes: three-dimensional growth<two-dimensional growth. Relationship of reaction chamber pressure for two growth modes: reaction chamber pressure of the three-dimensional growth is 200-300 mbar higher than that of two-dimensional growth. Relationship of growth rate for two growth modes: three-dimensional growth<two-dimensional growth.

The embodiments of the present disclosure will be described in detail with reference to the accompanying drawings to help understand the substantive features and practicability of the fabrication method of a nitride layer with an embedded nanopillar structure. However, it will be understood that the invention is not limited to the embodiments disclosed below.

Embodiment 1

A fabrication method for nitride layer with an embedded nanopillar structure is provided, mainly comprising steps:

(1) Provide a sapphire substrate 001 with different growth rates.

Figure 2:
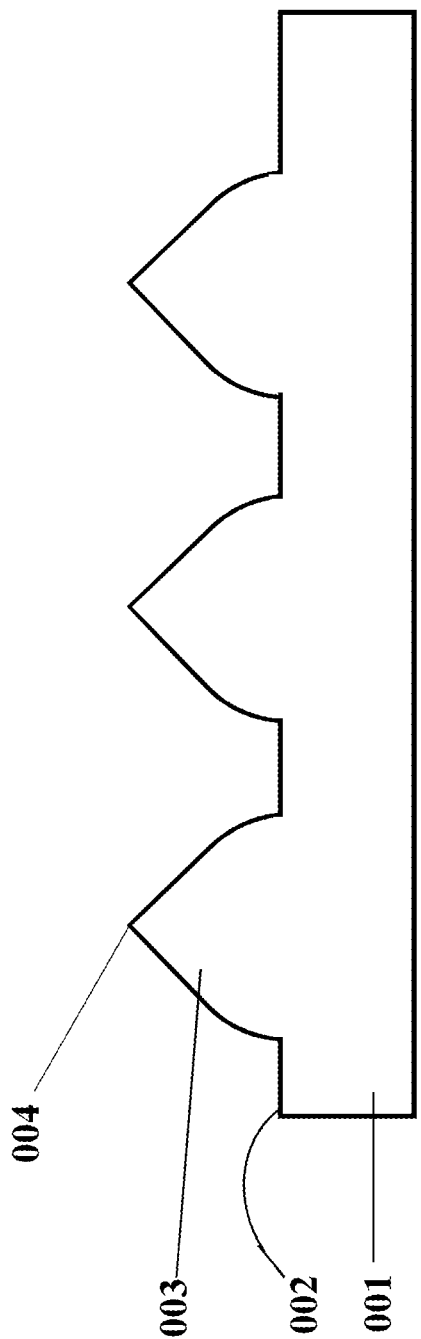
FIG. 2 illustrates a first step of fabricating a nitride layer structure with an embedded nanopillar structure according to some embodiments of the present disclosure.
Figure 3:
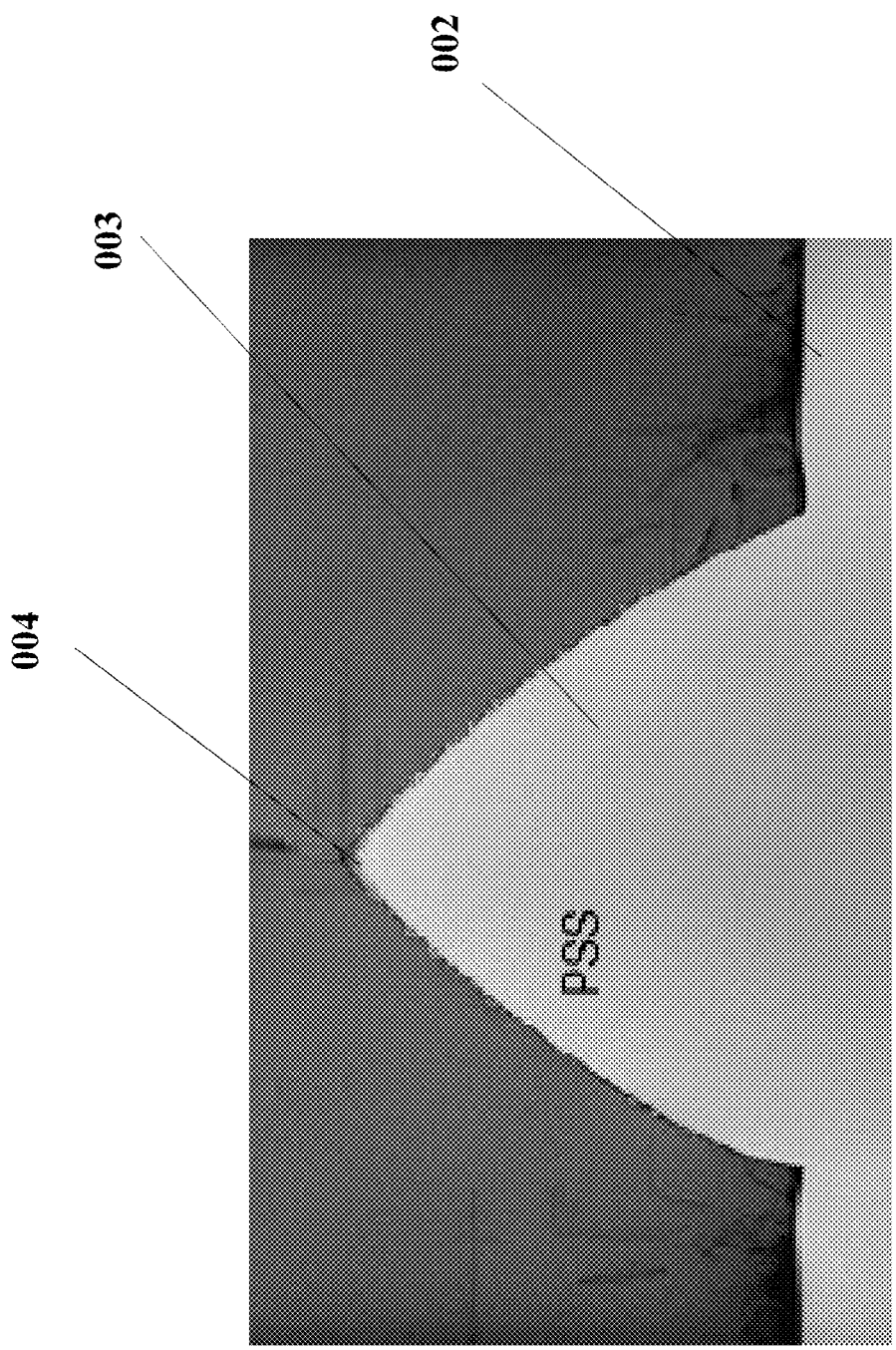
FIG. 3 illustrates a scanning electron microscope drawing of a pattern substrate.

As shown in FIG. 2, provide a pattern substrate 001, wherein, the pattern is a series of protrusion portions 003, the top 004 of each protrusion portion is preferably a cone shape, and protrusion portions are connected by a plane portion 002 (i.e., Plane C). In this embodiment, the aforesaid pattern is formed through dry ion etching (ICP); FIG. 3 is a scanning electron microscope drawing of the pattern substrate.

(2) Pre-treat the pattern substrate.

Figure 4:
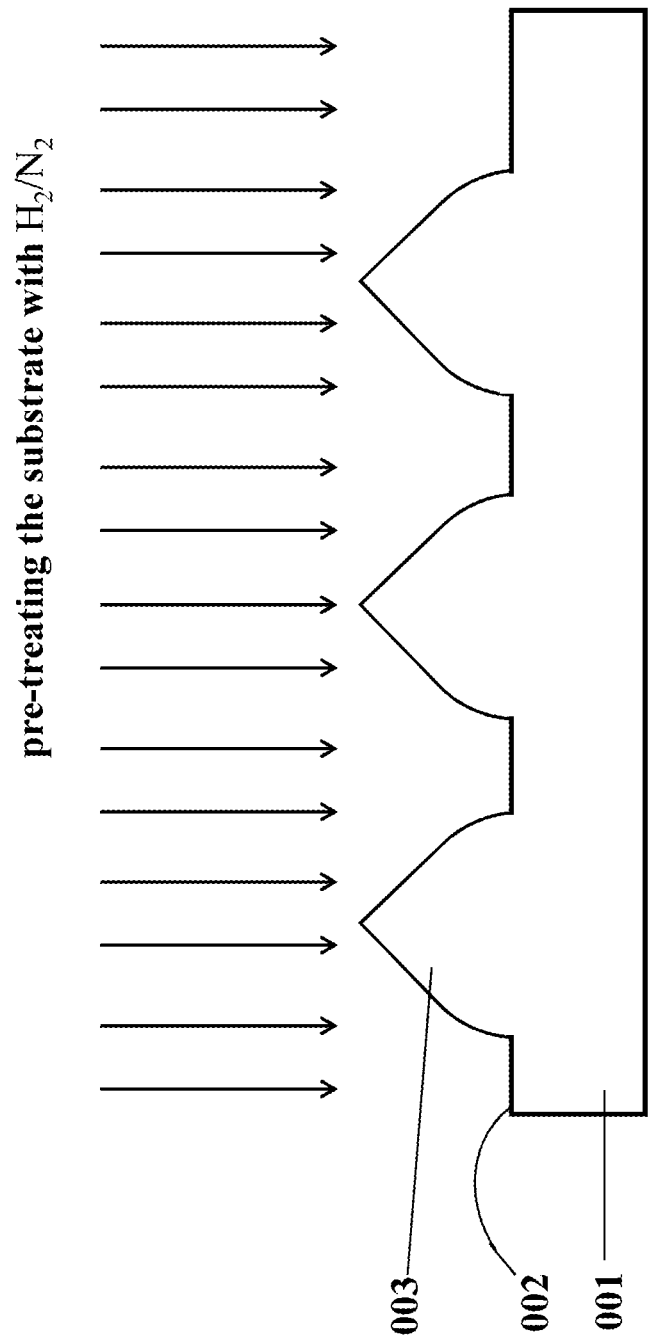
FIG. 4 illustrates a second step of fabricating a nitride layer structure with an embedded nanopillar structure according to some embodiments of the present disclosure.

As shown in FIG. 4, put the pattern substrate 001 into metal organic chemical vapor deposition (MOCVD) chamber to change rate of the patterned sapphire substrate into 60 rpm; the reaction chamber pressure is 100 Torr; rise temperature to 800-1,500° C. under mixed environment of $H_2$ and $N_2$, and keep 5-15 minutes for surface pretreatment. As the lattice plane at top and on the plane 002 of the substrate pattern 003 are different, the micro treatment effect of $N_2/H_2$ is different, resulting in different polarities and dangling bonds of the substrate surface.

Figure 5:
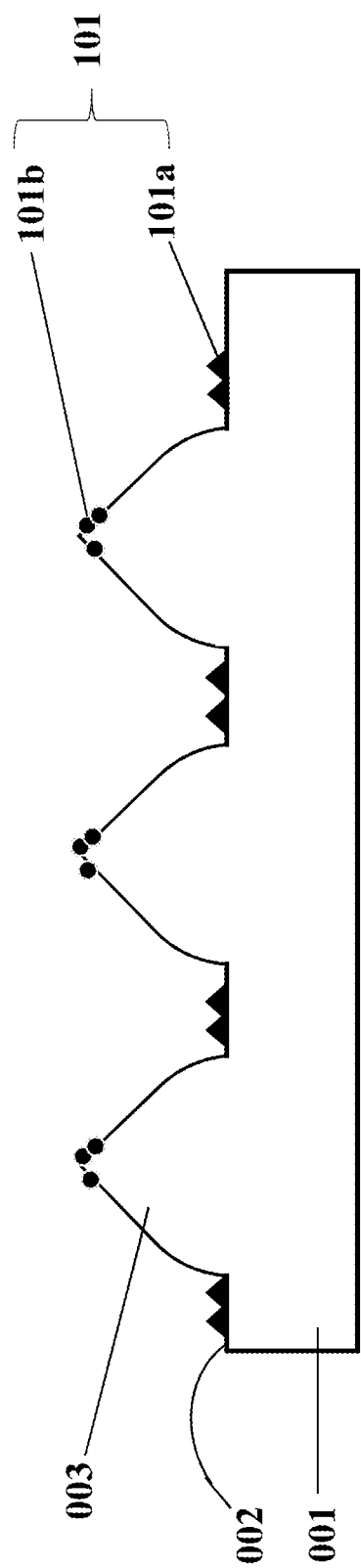
FIG. 5 illustrates a third step of fabricating a nitride layer structure with an embedded nanopillar structure according to some embodiments of the present disclosure.

After pre-treatment of the pattern substrate 001, lower substrate temperature to about 510-540° C.; control the reaction chamber pressure at 600 mbar; take N2 as the carrier gas and grow a nitride nucleating layer 101 with growth thickness of 10-50 nm under TMGa source flow and NH3 flow of 50 sccm and 24 L/min respectively. The nucleating layer 101 is mainly divided into a nucleating layer 101a on the surface of the plane portion 002 and the nucleating layer 101b on the surface of the protrusion portion top 004, as shown in FIG. 5.

(4) Grow a GaN layer as the first nitride layer 102 under three-dimensional growth conditions through epitaxial growth.

Figure 6:
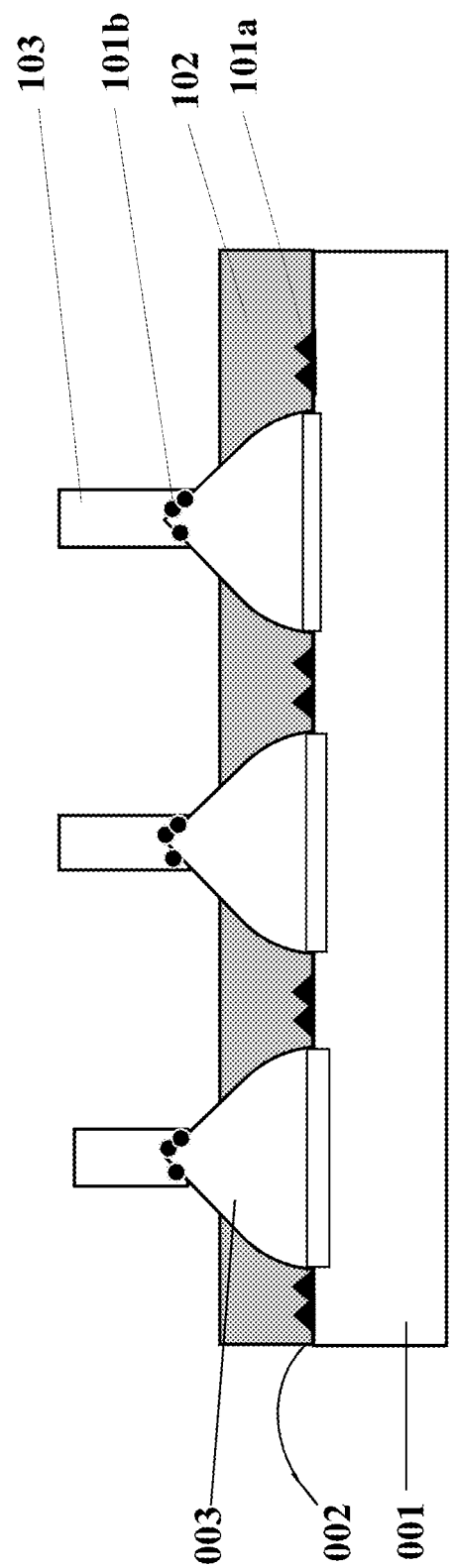
FIG. 6 illustrates a fourth step of fabricating a nitride layer structure with an embedded nanopillar structure according to some embodiments of the present disclosure.

Grow a GaN layer under three-dimensional growth conditions through epitaxial growth over the nucleating layer 101. Parameters of three-dimensional growth conditions: reaction chamber pressure: 500 mbar, substrate temperature 980-1,040° C., TMGa and NH3 as Ga source and N source respectively, carrier gas: H2, V/III ratio: 1,200, growth rate: 2.3 µm/h, and thickness about 1.3 µm. Due to different micro polarity and dangling bond on the top 004 and plane portion 002 of the substrate after pre-treatment of the substrate surface, a nucleating layer 101b is formed at the top of the substrate pattern, and a nucleating layer 101a is formed in the plane portion, wherein, polarity and nucleation size of the nucleating layers 101a and 101b differ a lot: the nucleating layer 101b favors subsequent growth of the nanopillar with low growth rate, and the horizontal epitaxial growth rate is slow; the nucleating layer 101a favors growth of the GaN epitaxial layer with high growth rate, and the horizontal epitaxial growth rate is high; therefore, after growth of the first nitride layer 102, a nanopillar structure 103 is formed at the top of the pattern substrate, as shown in FIG. 6.

(5) Grow a u-type GaN layer as the second nitride layer 104 under two-dimensional growth conditions through epitaxial growth.

Figure 7:
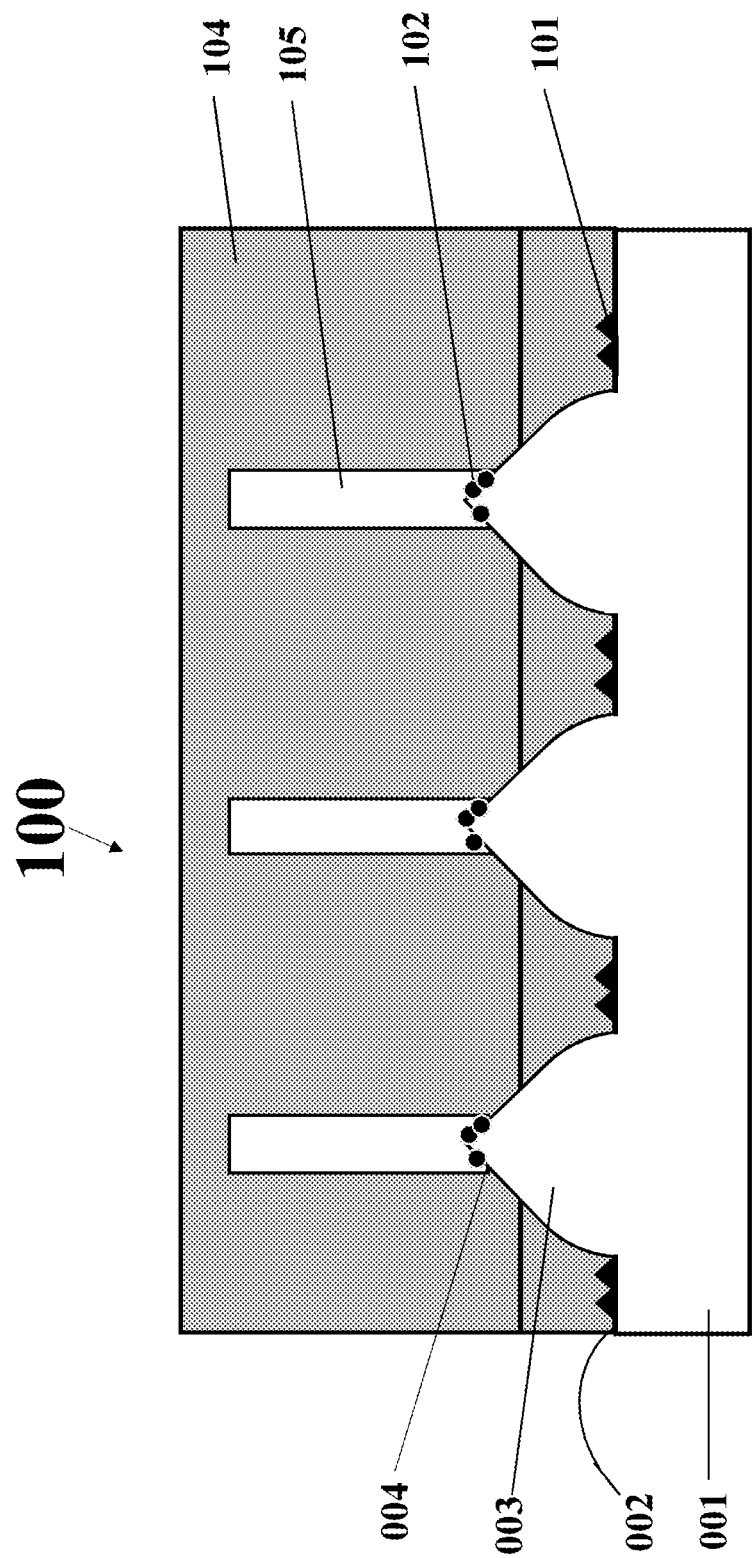
FIG. 7 illustrates a fifth step of fabricating a nitride layer structure with an embedded nanopillar structure according to some embodiments of the present disclosure.

Continuously grow a third nitride layer 104 over the first GaN layer 102 under two-dimensional growth conditions, which folds a uncracked plane above the nanopillar 103 to form an embedded nanopillar structure 105 over the nitride underlayer, as shown in FIG. 7. Parameters of two-dimensional growth conditions: reaction chamber pressure: 200 mbar, substrate temperature 1,040-1,070° C., TMGa and NH3 as Ga source and N source respectively, carrier gas: H2, V/III ratio: 1,300, growth rate: 3.0 µm/h, and thickness about 2 µm. Form an embedded nanopillar structure 105.

Figure 8:
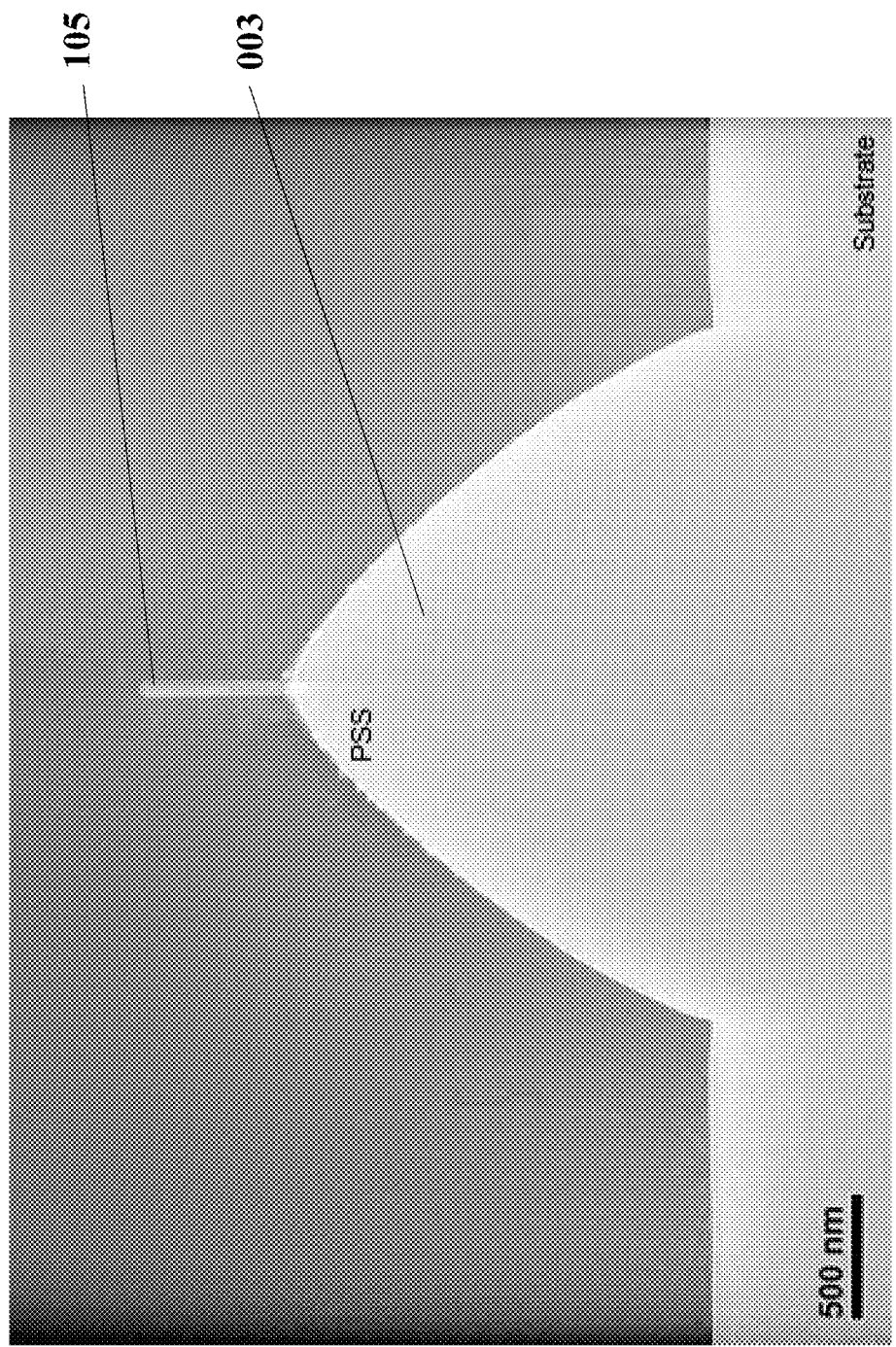
FIG. 8 is a section diagram of the scanning electron microscope drawing of the nitride underlayer with an embedded nanopillar structure in Embodiment 1.
Figure 9:
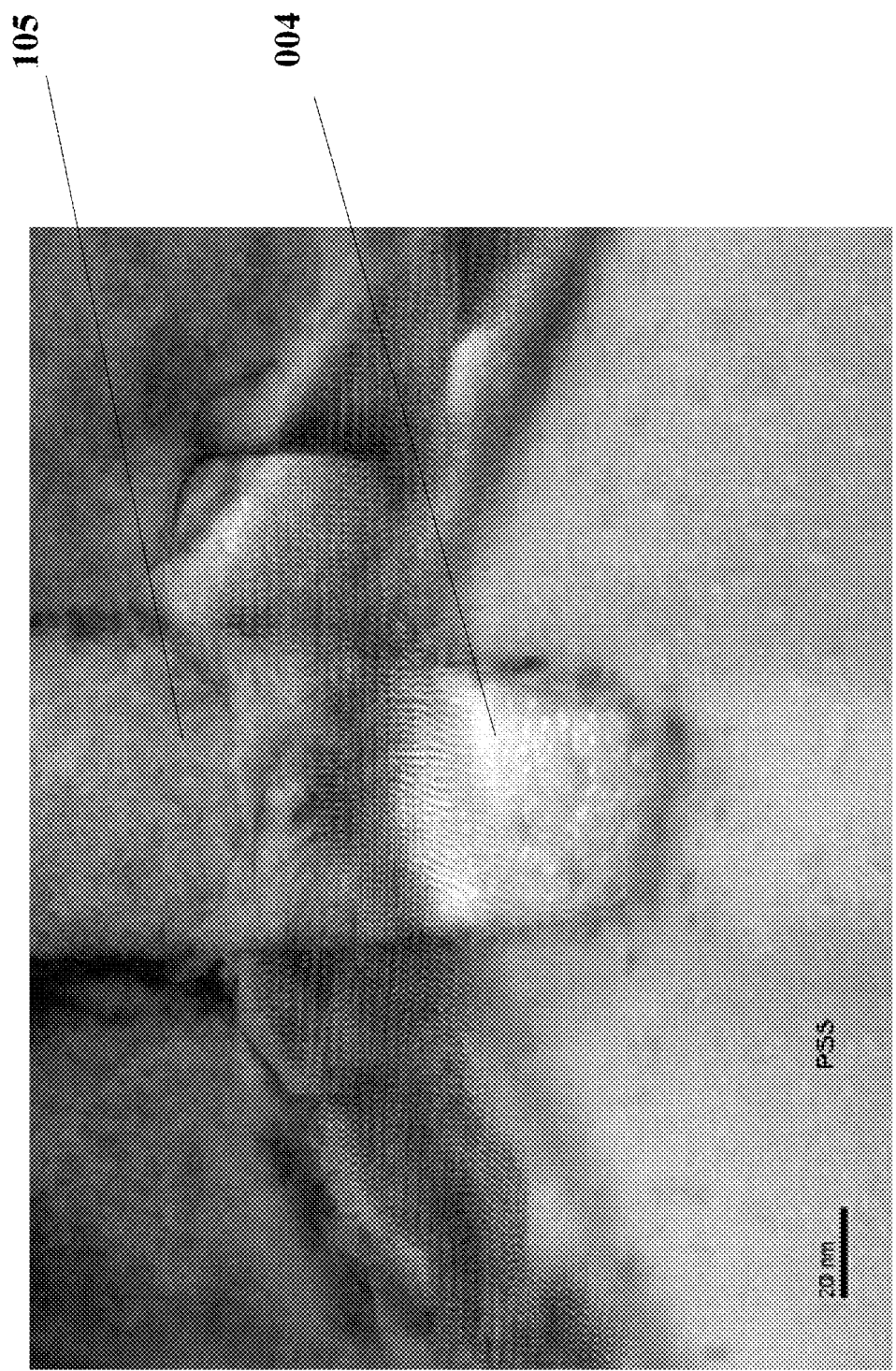
FIG. 9 is a bottom enlargement of the scanning electron microscope drawing of the nitride underlayer with an embedded nanopillar structure in Embodiment 1.

FIGS. 8 and 9 are scanning electron microscope sections of the nitride underlayer with an embedded structure.

FIG. 7 is a structural diagram of a nitride underlayer with an embedded nanopillar structure according to the aforesaid method. As shown in the figure, the structure comprises a pattern substrate 001, nucleating layers 101a and 101b, and a nitride layer comprising a first nitride layer 102, a nanopillar structure 105 and a second nitride layer 104. The pattern 003 of the substrate 001 is about 2.0 µm high with diameters of about 0.5-8 µm. Gap of each protrusion portion, in general, can be 0.01-5 µm, which is 0.3 µm in this embodiment. The nanopillar, with size less than 1 µm, is at the top of each substrate pattern. In some embodiments, the diameter is 10-10 nm, and the diameter is about 50 nm in this embodiment. The nanopillar size can be adjusted by controlling thickness of the first and the second nitride layers.

The thicker the first nitride layer 102 is, the smaller the nanopillar 105 is. The first nitride layer 102 is about 0.1-1.5 µm thick, and the second nitride layer is preferably above 2 µm. The first and second nitride layers can be made of GaN, AlN, AlGaN, InGaN, etc.

Figure 10:
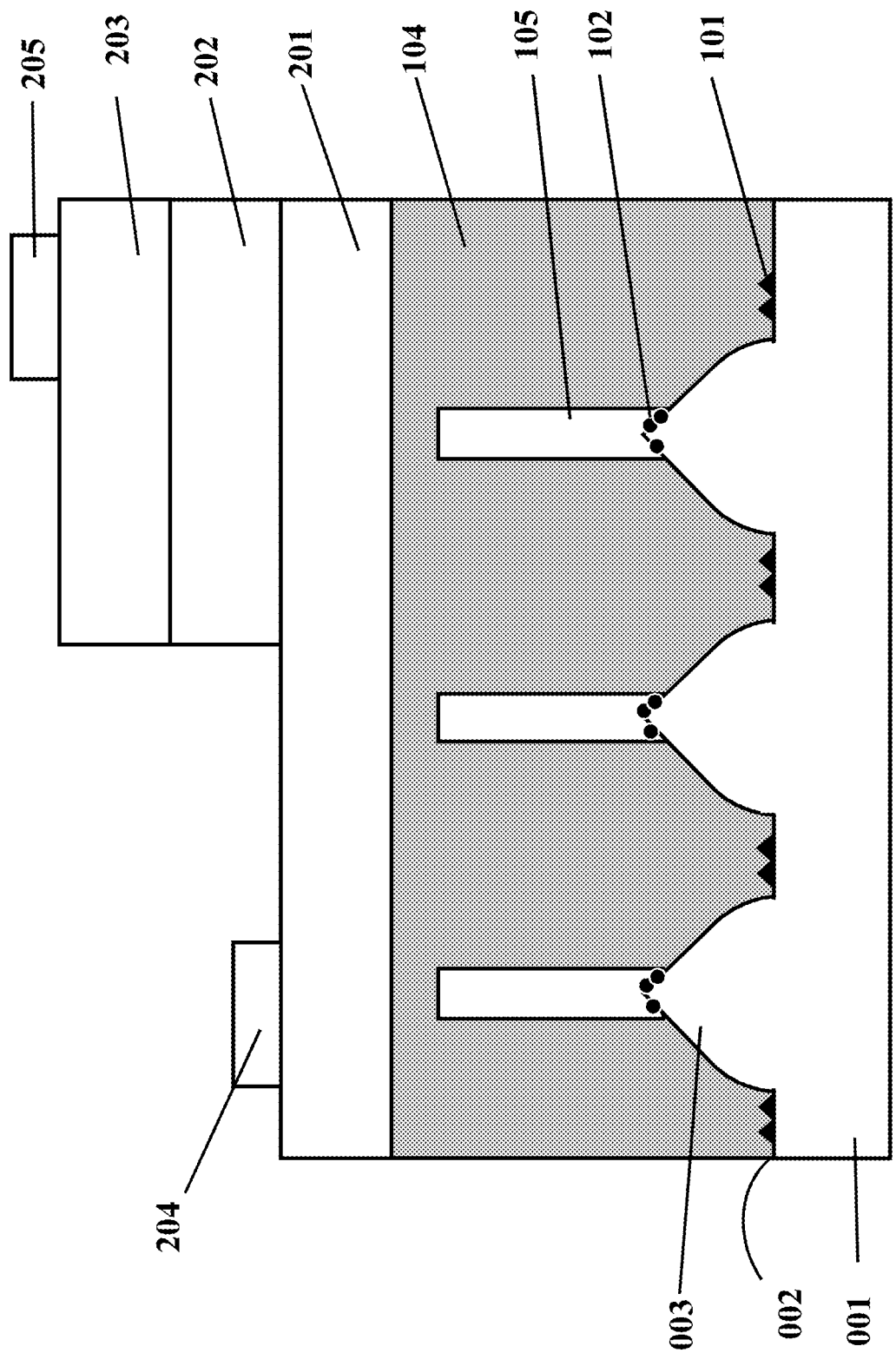
FIG. 10 is a structural diagram of a light emitting diode fabricated with the nitride underlayer with an embedded nanopillar structure in Embodiment 1.

With reference to FIG. 10, a nitride light emitting diode chip structure fabricated with the aforesaid nitride underlayer with the nanopillar structure 105, comprising an n-type semiconductor layer 201 over the nitride underlayer 100, an active layer 202, a p-type semiconductor layer 203, an n electrode 204 and a p electrode 205.

In this embodiment, an underlayer with a nanopillar structure is formed over the pattern substrate through epitaxial technology in combination of pattern substrate, and a GaN-based light emitting diode is formed through MOCVD or MBE epitaxial growth. Taking the patterned sapphire substrate as example, the formed nanopillar 105 is deeply embedded in the nitride material and formed at the top of sapphire substrate pattern. As the substrate pattern appears periodic arrangement, the nanopillar also appears periodic distribution, thus improving light extraction efficiency.

Further, the nitride underlayer 100 inherits the advantage of the pattern substrate for improving material quality; the nanopillar in sub-micron scale is formed in the material, which prevents large nanopillar size from influencing device appearance and pressure-resistant stability and avoids complex device process fabrication.

Embodiment 2

Difference between this embodiment and Embodiment 1 is that: The substrate pattern is a series of recess portions distributed on the surface. Specifically, the recess portion appears an inverted trapezoidal structure with a tilt side wall, wherein, the lattice growth rate of the side wall is slower than that of the bottom lattice plane. A nitride nucleating layer, a first nitride layer through three-dimensional growth and a second nitride layer through two-dimensional growth are formed on the bottom of the recess portion, wherein, the recess portion is at least 0.5 µm deep with preferred gap of 0.01-5 µm and diameter 0.5-8 µm.

At least one embodiment of the present disclosure can have one or more of the following advantages: for example, eliminating complex chip process for forming a nanopillar structure and removing impacts from chip process on chip reliability, thus effectively improving optoelectronic properties, stability and pressure-resistant reliability of the devices.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of fabricating a nitride underlayer, the method comprising:
    (1) providing a pattern substrate with lattice planes of different growth rates;
    (2) pre-treating the substrate;
    (3) growing a nitride nucleating layer over the substrate pattern;
    (4) forming a first nitride layer in three-dimensional growth conditions over the nitride nucleating layer, wherein the first nitride layer forms a nanopillar at a top of the substrate;
    (5) continuously growing a second nitride layer over the first nitride layer in two-dimensional growth conditions, wherein the second nitride layer forms an uncracked plane over the nanopillar and the nanopillar structure is embedded in the nitride underlayer.

2. The method of claim 1, wherein:
    an upper surface of the pattern substrate provided in step (1) has a plane portion and a protrusion portion; and
    the protrusion portion has a top area smaller than a bottom area.

3. The method of claim 2, wherein a horizontal growth rate of the nucleating layer in the plane portion in step (3) is faster than a horizontal growth rate of the top area of the protrusion portion.

4. The method of claim 2, wherein:
    the nucleating layer formed in step (3) is formed in the three-dimensional growth conditions;
    the nucleating layer in the plane portion facilitates the growth of the nitride epitaxial layer;
    the nucleating layer at the top area of the protrusion portion top facilitates the growth of the nanopillar; and
    a growth rate of the nanopillar is slower than a growth rate of the nitride epitaxial layer.

5. The method of claim 1, wherein the pre-treating the substrate comprises pre-treating with at least one or $H_2$ or $N_2$.

6. The method of claim 1, wherein the lattice plane over an upper surface of the substrate has different micro polarities and hanging bonds after the pre-treating.

7. The method of claim 1, wherein:
    the growing the nitride nucleating layer is under quasi two-dimensional growth conditions in step (3); and
    the quasi two-dimensional growth conditions comprise a condition where a ratio between horizontal and vertical growth rates is between those of two-dimensional growth conditions and three-dimensional growth conditions.

8. The method of claim 1, wherein the nanopillar structure has an adjustable size by controlling thicknesses of the first nitride layer and the second nitride layer.

9. A nitride underlayer, comprising:
    a pattern substrate with lattice planes of different growth rates;
    a nitride nucleating layer over the pattern substrate;
    a first nitride layer with three-dimensional growth over the nitride nucleating layer, and forming a nanopillar structure at a top of the substrate;
    a second nitride layer with two-dimensional growth over the first nitride layer, and folding into an uncracked plane over the nanopillar structure.

10. The nitride underlayer of claim 9, wherein:
    an upper surface of the pattern substrate has a plane portion and a protrusion portion; and
    the protrusion portion has a top area is smaller than a bottom area.

11. The nitride underlayer of claim 10, wherein the nanopillar is located over the protrusion portion of the substrate.

12. The nitride underlayer of claim 9, wherein:
    the substrate comprises a series of protrusion portions and a plane portion;

each of the protrusion portions has a cone-shaped top with an angle between a lattice plane of the top and a lattice plane of the plane portion less than 5°.

13. The nitride underlayer of claim 9, wherein an upper surface of the pattern substrate has protrusion or recess patterns with a height of at least 0.5 μm and a gap larger than 0.01 μm.

14. The nitride underlayer of claim 9, wherein the nanopillar structure has a diameter of 10-100 nm.

15. The nitride underlayer of claim 9, wherein the nanopillar structure height is 0.1-1.5 μm.

16. The nitride underlayer of claim 9, wherein the nanopillar structure has a sub-micron scale, is located at the top of the protrusion portion and has a periodic arrangement according to an arrangement of the protrusion portions.

17. The nitride underlayer of claim 9, wherein a thickness of the second nitride layer is at least 2 μm.

18. A nitride underlayer, comprising:
a patterned substrate having a series of protrusion portions or recess portions at a surface of the patterned substrate;
a nitride layer over the patterned substrate, wherein:
a nanopillar structure is in the nitride layer;
wherein the nanopillar structure is in a sub-micron scale, and is at a top of the protrusion portion or the recess portion.

19. The nitride underlayer of claim 18, wherein:
the nitride layer comprises a nitride nucleating layer, a first nitride layer through three-dimensional growth and a second nitride layer through two-dimensional growth; and
the nanopillar structure is formed at the substrate top by the first nitride layer and the second nitride layer.

20. A semiconductor device comprising a nitride underlayer of claim 9.

* * * * *